(12) United States Patent
Bang et al.

(10) Patent No.: US 10,964,674 B2
(45) Date of Patent: Mar. 30, 2021

(54) MICRO-LED DISPLAY PANEL

(71) Applicant: LUMENS CO., LTD., Yongin-si (KR)

(72) Inventors: Jeongho Bang, Yongin-si (KR); Juok Seo, Yongin-si (KR); Taekyung Yoo, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 57 days.

(21) Appl. No.: 16/261,985

(22) Filed: Jan. 30, 2019

(65) Prior Publication Data

US 2019/0244938 A1 Aug. 8, 2019

(30) Foreign Application Priority Data

Feb. 6, 2018 (KR) .................. 10-2018-0014447
Mar. 16, 2018 (KR) .................. 10-2018-0031013

(51) Int. Cl.
*H01L 25/075* (2006.01)
*H01L 33/50* (2010.01)
*H01L 33/58* (2010.01)
*H01L 33/62* (2010.01)

(52) U.S. Cl.
CPC ........ *H01L 25/0753* (2013.01); *H01L 33/502* (2013.01); *H01L 33/58* (2013.01); *H01L 33/62* (2013.01); *H01L 33/504* (2013.01); *H01L 2933/0041* (2013.01); *H01L 2933/0058* (2013.01); *H01L 2933/0066* (2013.01)

(58) Field of Classification Search
CPC ... H01L 25/0753; H01L 33/502; H01L 33/58; H01L 33/62; H01L 33/504; H01L 2933/0066; H01L 2933/0041; H01L 2933/0058
See application file for complete search history.

(56) References Cited

U.S. PATENT DOCUMENTS

| 2015/0249069 | A1* | 9/2015 | Yoshida | ................. H01L 33/505 257/89 |
| 2018/0151543 | A1* | 5/2018 | Lee | ........................... H01L 33/58 |
| 2019/0012957 | A1* | 1/2019 | Liu | ......................... G06F 1/1643 |
| 2020/0043901 | A1* | 2/2020 | Ahmed | .................... H01L 33/62 |
| 2020/0127173 | A1* | 4/2020 | Park | ......................... H01L 33/52 |

* cited by examiner

*Primary Examiner* — Cuong B Nguyen
*Assistant Examiner* — Juanita B Rhodes
(74) *Attorney, Agent, or Firm* — Mei & Mark LLP

(57) ABSTRACT

A micro-LED display panel is disclosed. The micro-LED display panel includes: a plurality of unit substrates, each of which is formed with a plurality of electrode pads; a plurality of pixels, each of which includes a first micro-LED chip, a second micro-LED chip, and a third micro-LED chip mounted corresponding to the electrode pads; and a mesh arranged over the plurality of unit substrates. The mesh has pixel spacing portions covering at least some exposed areas of the plurality of unit substrates between the pixels and a plurality of openings accommodating the corresponding pixels. The micro-LED display panel is constructed such that the reflection of external light by the exposed areas of the substrate between the pixels and the exposed areas of the electrode pads disposed on the unit substrates is reduced. This construction improves the contrast characteristics and black characteristics of a display and achieves seamlessness in the micro-LED display panel.

19 Claims, 14 Drawing Sheets (a)

(b) I-I section (a)

(b)

MICRO-LED DISPLAY PANEL

BACKGROUND OF THE INVENTION

1. Field of the Invention

The present invention relates to a micro-LED display panel. More specifically, the present invention is related to a technology for achieving anti-reflectivity and seamlessness in a micro-LED display panel and a technology in which external light is prevented from being reflected by a micro-LED display panel, achieving a seamless display with improved black characteristics.

2. Description of the Related Art

Display devices using light emitting diodes (LEDs) as backlight sources have been proposed. Particularly, full-color LED display devices have been proposed in which LEDs emitting light of different wavelengths are grouped to form pixels and the pixels are arrayed in a matrix. Furthermore, micro-LED displays for high-resolution full-color LED display devices have been proposed in which micro-LED chips constitute pixels and the length of one side of each chip is not more than 100 micrometers. In the micro-LED displays, each pixel consists of a group of micro-LEDs emitting light of different wavelengths.

A micro-LED display panel for a micro-LED display does not require the use of a liquid crystal material and can be reduced in thickness compared to conventional LCD panels, i.e. panels using LEDs as BLUs. Furthermore, a display using a micro-LED display panel have many advantages in terms of response time, viewing angle, residual image, and color representation over LCD displays.

A micro-LED display panel has the problem that external light (light from an external illumination source or natural light) is reflected by areas of the entire surface of a substrate where LED chips are not mounted, i.e. exposed areas of the substrate between neighboring pixels and exposed areas of the substrate between LED chips in the pixels. Particularly, in the case where electrode pads disposed corresponding to the micro-LED chips on the substrate are partially exposed to electrically connect electrodes of the micro-LED chips, external light is strongly reflected by the exposed areas of the electrode pads. Thus, the reflection of external light deteriorates contrast characteristics, inevitably leading to poor display image quality. Thus, there is a need to solve the problems associated with the reflection of external light by the areas, achieving improved contrast characteristics or black characteristics.

In the case where a micro-LED display panel for a micro-LED display consists of an array of a plurality of modules, seams between the modules deteriorate the image quality of the display. This problem needs to be solved to achieve seamlessness in the display.

Therefore, there is a need for solutions to the above-described problems in the field of micro-LED displays.

SUMMARY OF THE INVENTION

The present invention has been made in view of the above problems, and it is one object of the present invention to provide a micro-LED display panel in which a mesh structure is used to reduce the reflection of external light by exposed areas of a substrate between LED chips and exposed areas of the substrate between pixels to improve contrast characteristics or black characteristics, achieving high display image quality.

It is a further object of the present invention to provide a micro-LED display panel in which a mesh structure is used to solve the problem of poor display image quality caused by seams between a plurality of unit modules.

It is another object of the present invention to provide a micro-LED display panel that can be used to reduce the occurrence of color mura in a micro-LED display and a method for fabricating the micro-LED display panel.

A micro-LED display panel according to one aspect of the present invention includes: a unit substrate; a plurality of pixels mounted on the unit substrate and each including a first LED chip, a second LED chip, and a third LED chip; and a mesh including first openings, second openings, and third openings individually accommodating the first LED chips, the second LED chips, and the third LED chips, respectively, and arranged on the unit substrate, wherein chip spacing portions are formed in the mesh to cover exposed areas of the substrate between the first LED chips and the second LED chips and between the second LED chips and the third LED chips.

According to one embodiment, the micro-LED display panel further includes a first wavelength converting material covering the upper sides of the first LED chips and converting the wavelength of light from the first LED chips to output first light.

According to one embodiment, the first LED chips, the second LED chips, and the third LED chips emit light of a first wavelength.

According to one embodiment, the first LED chips and the third LED chips emit light of a wavelength and the second LED chips emit light of a second wavelength longer than the first wavelength.

According to one embodiment, the micro-LED display panel further includes a second wavelength converting material covering the upper sides of the second LED chips and converting the wavelength of light from the second LED chips to output second light.

According to one embodiment, the micro-LED display panel further includes a translucent material covering the upper sides of the third LED chips.

According to one embodiment, the micro-LED display panel further includes a translucent material covering the upper sides of the second LED chips and the upper sides of the third LED chips.

According to one embodiment, the mesh covers the unit substrate and adjacent portions of the unit substrate.

According to one embodiment, the mesh is arranged on the unit substrate to cover the exposed areas of the substrate between the pixels.

According to one embodiment, the mesh includes pixel spacing portions covering the exposed areas of the substrate between the pixels and module spacing portions covering the unit substrate and adjacent portions of the unit substrate.

According to one embodiment, the module spacing portions and the pixel spacing portions have the same width.

According to one embodiment, the widths of the pixel spacing portions are larger than the widths of the chip spacing portions.

According to one embodiment, the mesh is black in color.

According to one embodiment, the micro-LED display panel further include a protective film and the first wavelength converting material is located between the protective film and the first LED chips.

According to one embodiment, a second wavelength converting material or a translucent material is located between the second LED chips and the protective film and between the third LED chips and the protective film.

According to one embodiment, the first wavelength converting material is selected from quantum dot (QD) resin materials, phosphors-in-glass (PIGs), phosphors-in-silicon (PISs), and phosphor ceramics (PCs).

A micro-LED display panel according to another aspect of the present invention includes: a plurality of unit substrates, each of which is formed with a plurality of electrode pads; a plurality of pixels, each of which includes a first micro-LED chip, a second micro-LED chip, and a third micro-LED chip mounted corresponding to the electrode pads; and a mesh arranged over the plurality of unit substrates, wherein the mesh has pixel spacing portions covering at least some exposed areas of the plurality of unit substrates between the pixels and a plurality of openings accommodating the corresponding pixels.

According to one embodiment, the pixel spacing portions cover at least some exposed areas of the electrode pads between the pixels.

According to one embodiment, the mesh includes module spacing portions covering the upper surfaces of adjacent portions between the adjacent plurality of unit substrates.

According to one embodiment, the pixel spacing portions are in contact with the pixels.

According to one embodiment, each of the openings has a size larger than that of the corresponding pixel and the size of the opening is different by not more than 20 micrometers from the size of the pixel.

According to one embodiment, the pixel spacing portions are supported by the electrode pads.

According to one embodiment, the lower surface of each of the pixel spacing portions has an upper end and a lower end divided by a step and the upper end is in contact with at least some exposed areas of the electrode pads between the pixels.

According to one embodiment, the lower end is in contact with the exposed upper surface of the unit substrate between the pixels.

According to one embodiment, the lower end is spaced apart from the exposed upper surface of the unit substrate between the pixels.

According to one embodiment, the first micro-LED chips, the second micro-LED chips, and the third micro-LED chips emit blue light.

According to one embodiment, the micro-LED display panel further includes a first wavelength converting material covering the upper sides of the first LED chips and converting the wavelength of light from the first LED chips to produce red light.

According to one embodiment, the micro-LED display panel further includes a second wavelength converting material covering the upper sides of the second LED chips and converting the wavelength of light from the second LED chips to produce green light.

According to one embodiment, the micro-LED display panel further includes a translucent material covering the upper sides of the third LED chips.

According to one embodiment, the micro-LED display panel further includes a protective film.

According to one embodiment, the first wavelength converting material is located between the protective film and the first micro-LED chips.

According to one embodiment, the second wavelength converting material is located between the protective film and the second micro-LED chips.

According to one embodiment, the translucent material is located between the protective film and the second micro-LED chips.

According to one embodiment, the first micro-LED chips and the third micro-LED chips emit blue light and the second micro-LED chips emit green light.

According to one embodiment, the micro-LED display panel further includes a translucent material covering the upper sides of the second micro-LED chips and the upper sides of the third micro-LED chips.

According to one embodiment, the mesh is black in color.

The micro-LED display panels of the present invention are constructed such that the reflection of external light by the exposed areas of the substrate between the LED chips of the pixels and the exposed areas of the substrate between the pixels is reduced. This construction improves contrast characteristics or black characteristics to achieve high display image quality.

In addition, the problem of poor display image quality caused by seams between the unit modules is solved, achieving seamlessness in the micro-LED display panels.

Furthermore, the micro-LED display panels of the present invention are constructed such that the reflection of external light by the exposed areas of the substrate between the pixels and the exposed areas of the electrode pads disposed on the unit substrates is reduced. Due to this construction, the micro-LED display panels can be used to manufacture displays with improved contrast characteristics and black characteristics as well as wide side viewing angle.

Moreover, the use of the micro-LED display panels according to the present invention is effective in reducing the occurrence of color mura in displays.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 16 and 17 illustrate cases in which color mura occurs in micro-LED displays; and FIGS. 18 to 23 illustrate methods for fabricating micro-LED display panels according to exemplary embodiments of the present invention, specifically FIG. 18 illustrates a method for fabricating a micro-LED display panel including filling an underfill, integrating a transparent film with mesh pieces, and attaching the integrated structure, (a) of FIG. 19 is an enlarged view of area A6 of FIG. 18, (b) of FIG. 19 illustrates an example of the mesh used in FIG. 18 and an integrated structure in which the transparent film is attached to the mesh pieces, FIG. 20 illustrates another method for fabricating a micro-LED display panel including filling an underfill and attaching a mesh, (a) of FIG. 21 is an enlarged view of area A7 of FIG. 20, (b) of FIG. 21 illustrates an example of the mesh used in FIG. 20 (the mesh may be substantially the same as the mesh illustrated in FIG. 14), FIG. 22 illustrates another method for fabricating a micro-LED display panel including filling a molding material between pixels and between micro-LED chips R, G, and B in the pixels and attaching an anti-glare (AG) film or coating an anti-glare material, and FIG. 23 is an enlarged view of area A8 of FIG. 22.

DETAILED DESCRIPTION OF THE INVENTION

Preferred embodiments of the present invention will now be described with reference to the accompanying drawings. It should be noted that the drawings and embodiments are simplified and illustrated such that those skilled in the art can readily understand the present invention.

Figure 1:
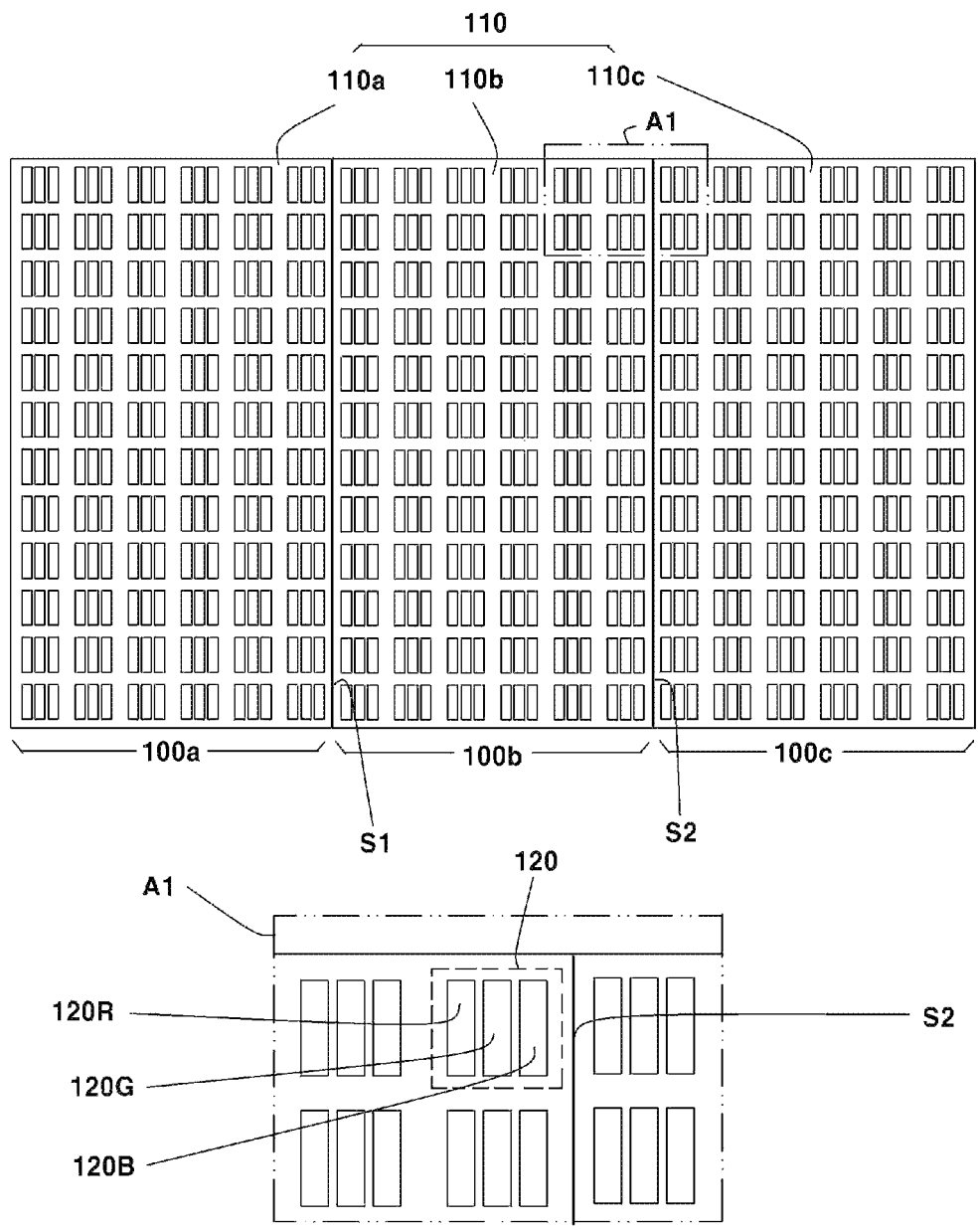
FIG. 1 is a plan view illustrating a micro-LED display panel according to one embodiment of the present invention in which pixels consisting of groups of LED chips are mounted on a substrate (top) and an enlarged view of area A1 (bottom)
Figure 2:
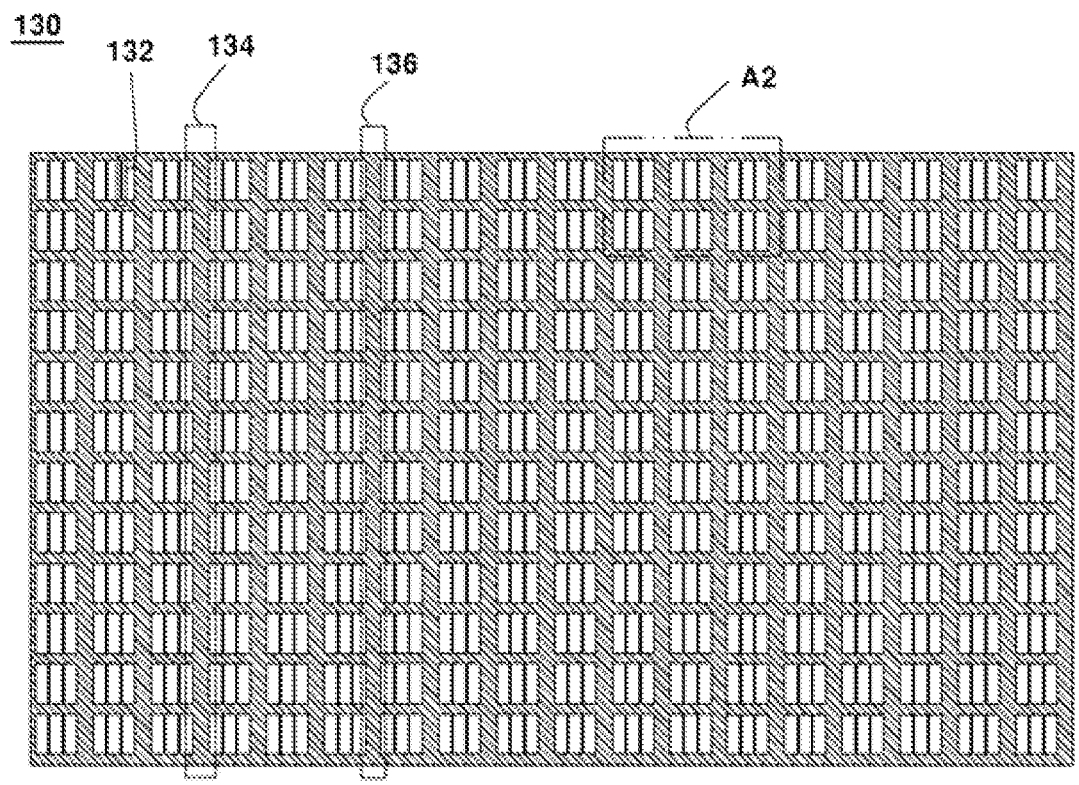
FIG. 2 is a plan view of a mesh to be bonded to the upper surface of the substrate mounted with the pixels of FIG. 1 (top) and an enlarged view of area A2 (bottom)
Figure 2:
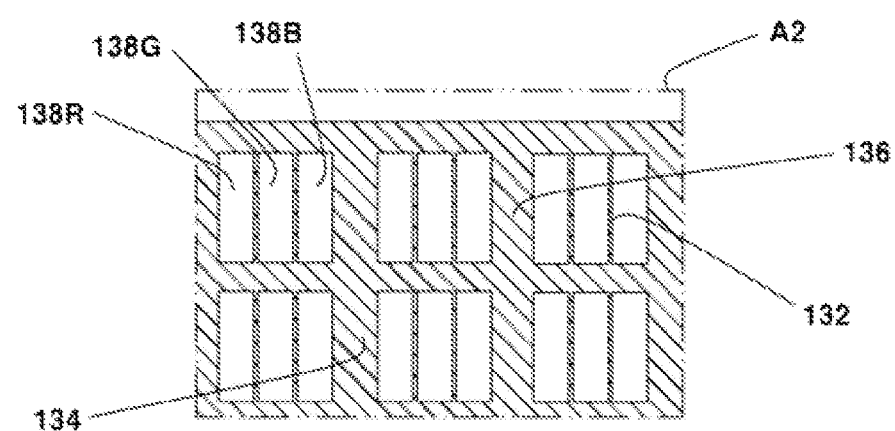
Figure 3:
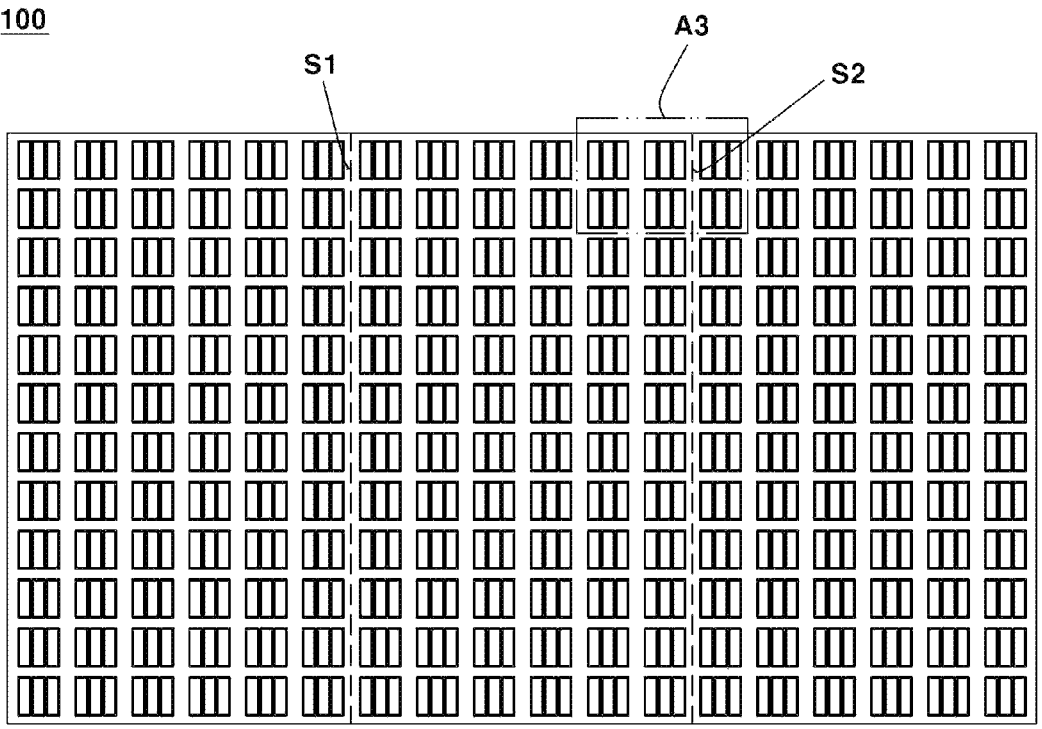
FIG. 3 is a plan view of a micro-LED display panel according to one embodiment of the present invention in which the mesh of FIG. 2 is bonded to the substrate mounted with the pixels of FIG. 1.
Figure 4:
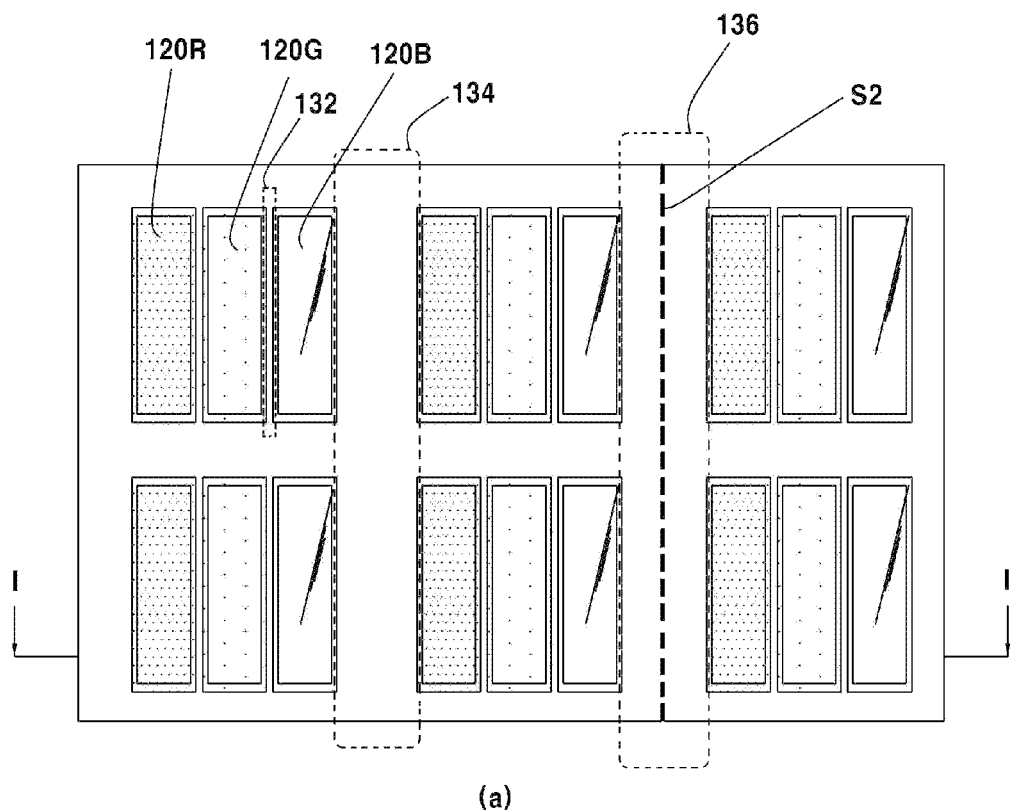
FIGS. 4 and 5 are examples of enlarged views of area A3 of FIG. 3 and their corresponding cross-sectional views.
Figure 4:
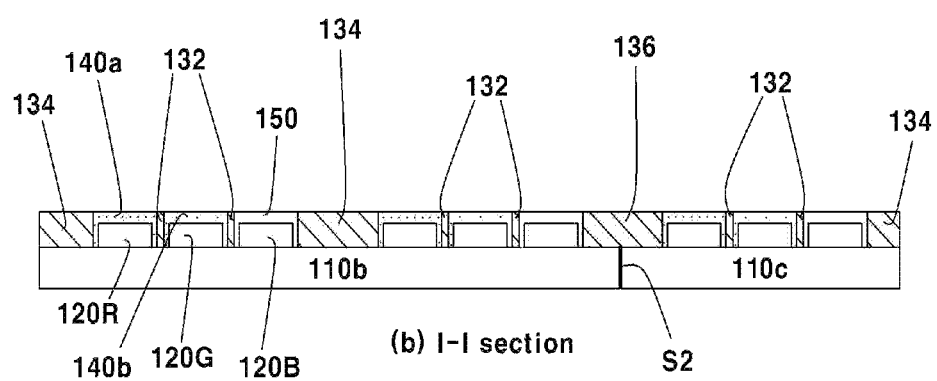
Figure 5:
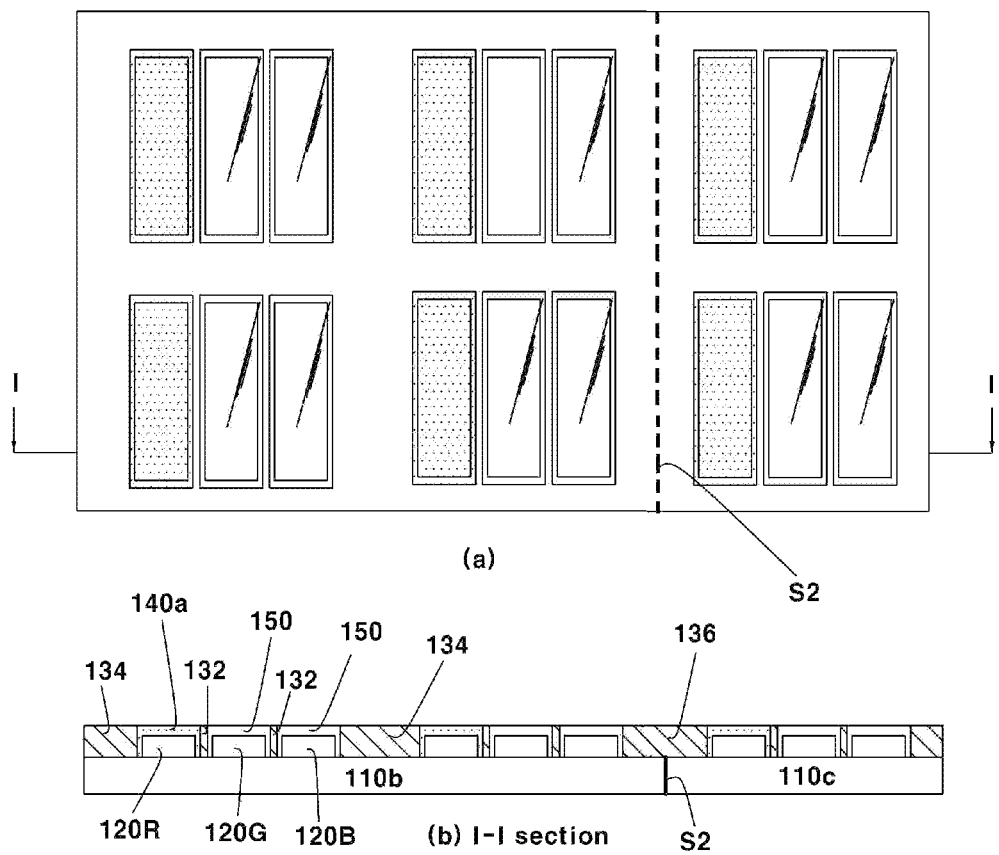
Figure 6:
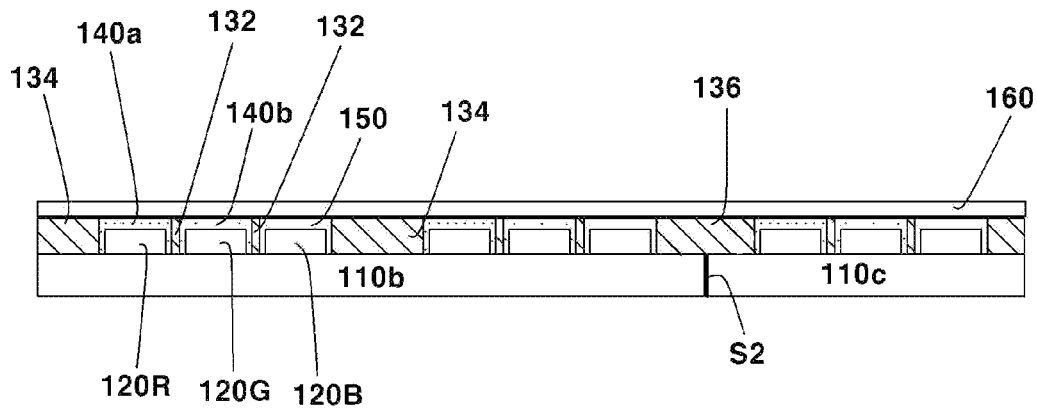
FIG. 6 is a cross-sectional view illustrating an exemplary embodiment of the present invention in which a protective film is further attached to the micro-LED display panel of FIG. 3.

FIG. 1 is a plan view illustrating a micro-LED display panel (100 of FIG. 3) according to one embodiment of the present invention in which pixels consisting of groups of LED chips are mounted on a substrate 110, FIG. 2 is a plan view of a mesh 130 to be bonded to the upper surface of the substrate 110 mounted with the pixels 120 of FIG. 1, FIG. 3 is a plan view of a micro-LED display panel 100 according to one embodiment of the present invention in which the mesh 130 mounted with the pixels 120 of FIG. 2 is bonded to the substrate 110 of FIG. 1, FIGS. 4 and 5 are examples of enlarged views of area A3 of FIG. 3 and their corresponding cross-sectional views, and FIG. 6 is a cross-sectional view illustrating an exemplary embodiment of the present invention in which a protective film 160 is further attached to the micro-LED display panel 100 of FIG. 3.

Referring to these figures, the micro-LED display panel 100 according to one embodiment of the present invention includes a plurality of unit modules 100a, 100b, and 100c. As used herein, the term "one module" or "unit module" refers to a structure in which a plurality of pixels are mounted on one unit substrate. Thus, the unit modules 100a, 100b, and 100c include unit substrates 110a, 110b, and 110c, respectively. That is, the unit module 100a includes the unit substrate 110a, the unit module 100b includes the unit substrate 110b, and the unit module 100c includes the unit substrate 110c. The unit substrates 110a, 110b, and 110c are collectively referred to as a substrate 110. The micro-LED display panel 100 includes a plurality of pixels 120 and a mesh. The mesh (130, FIG. 2) includes chip spacing portions 132 covering exposed areas of the substrate between LED chips, pixel spacing portions 134 covering exposed areas of the substrate between the pixels, and module spacing portions 136 covering adjacent portions between the adjacent unit substrates. By the chip spacing portions 132, a wavelength converting material or a translucent material can be easily applied to the upper side of the corresponding LED chip and the rectilinearity of light from the LED can be improved. The pixel spacing portions 134 improve the black characteristics of the unit substrates and ensure effective covering of seams with the module spacing portions 136, achieving a seamless display.

The micro-LED display panel 100 includes a first wavelength converting material (140a, FIG. 4 or 5) and/or a second wavelength converting material (140b, FIG. 4) and a translucent material 150. The plurality of pixels 120 are mounted on each of the unit substrates 110a, 110b, and 110c. For convenience, only one of the pixels is denoted by reference numeral 120 in FIG. 1. Each of the pixels 120 includes a first LED chip 120R, a second LED chip 120G, and a third LED chip 120B. As illustrated in the enlarged view of area A1 of FIG. 1, the pixel 120 includes three LED chips 120R, 120G, and 120B. The LED chips 120R, 120G, and 120B will be described in detail with reference to vertical cross-sectional views of FIGS. 4 and 5. In FIG. 1, reference numerals S1 and S2 indicate seams between the unit modules 100a, 100b, and 100c.

The mesh 130 is bonded to the unit modules 100a, 100b, and 100c (i.e. the substrate 110 mounted with the plurality of pixels 120) of FIG. 1 and includes a plurality of openings 138R, 138G, and 138B, as illustrated in FIG. 2. As illustrated in the enlarged view of area A2 at the bottom of FIG. 2, the plurality of openings 138R, 138G, and 138B individually accommodate the LED chips 120R, 120G, and 120B, respectively. That is, the first opening 138R accommodates the first LED chip 120R, the second opening 138G accommodates the second LED chip 120G, and the third opening 138B accommodates the third LED chip 120B. The sizes of the openings 138R, 138B, and 138G are preferably designed to be larger than those of the corresponding LED chips. These dimensions compensate for tilting of the LED chips when the LED chips are mounted on the substrate 110.

As illustrated in FIG. 1, the substrate 110 consists of the three unit substrates 110a, 110b, and 110c. The plurality of pixels 120 are mounted on the unit substrates 110a, 110b, and 110c and the mesh 130 has dimensions corresponding to the pixels 120 mounted on the unit substrates 110a, 110b, and 110c. The plurality of openings 138R, 138G, and 138B of the mesh 130 are formed corresponding to the LED chips 120R, 120G, and 120B. With these dimensions, the mesh 130 serves to mask areas other than the areas of the substrate 110 where the LED chips 120R, 120G, and 120B are mounted. In other words, the mesh 130 serves to mask exposed areas between the first LED chips 120R and the second LED chips 120G and the second LED chips 120G and the third LED chips 120B. The masking of the exposed areas of the substrate between the LED chips reduces the reflection of external light by the exposed areas, leading to an improvement in display image quality. To this end, the mesh 130 includes the chip spacing portions 132 covering the exposed areas of the substrate between the LED chips, the pixel spacing portions 134 covering the exposed areas of the substrate between the neighboring pixels, and the module spacing portions 136 covering the seams between the neighboring unit substrates.

FIG. 3 illustrates a state in which the mesh (130 of FIG. 2) is bonded to the substrate 110 (FIG. 1) mounted with the plurality of pixels 120. For full-color display, each pixel should emit red light, green light, and blue light and the pixels should be controlled independently. For example, the three LED chips 120R, 120G, and 120B constituting each pixel may be constructed to emit red light, green light, and blue light, respectively, as illustrated in FIG. 3. Exemplary embodiments of the pixels emitting red light, green light, and blue light for full-color display will be described with reference to FIGS. 4 and 5.

As exemplified in FIG. 4, the LED chips 120R, 120G, and 120B are LED chips emitting light of a first wavelength (for example, blue light), the first wavelength converting material covers the upper sides of the first LED chips 120R and converts the wavelength of light from the first LED chips to output first light (e.g., red light), and the second wavelength converting material converts the wavelength of light from the second LED chips 120G to output second light (green light).

(a) of FIG. 4 is an enlarged view of area "A3" of FIG. 3. Left four pixels with respect to the seam S2 are mounted on the unit substrate 110b and right two pixels with respect to the seam S2 are mounted on the unit substrate 110c. Each of the pixels includes the first LED chip 120R, the second LED chip 120G, and the third LED chip 120B. As mentioned earlier, the mesh 130 is bonded to the substrate 110 mounted with the LED chips, the chip spacing portions 132 are located between the LED chips, the pixel spacing portions 134 are located between the neighboring pixels, and the module spacing portions 136 are located on the seams between the neighboring unit modules. The adjacent unit substrates are connected to each other at the seams between the neighboring modules. Thus, the module spacing portions 136 cover the adjacent portions between the adjacent unit substrates.

(b) of FIG. 4 is a cross-sectional view taken along line I-I of (a). For full-color display, a wavelength converting material or a translucent material is covered on the three LED chips (blue LED chips) emitting light of a first wavelength (e.g., blue light) mounted on the substrate 110.

Specifically, the upper sides of the first LED chips 120R are covered with the first wavelength converting material 140a. The first wavelength converting material 140a converts light of a first wavelength (blue light) emitted from the first LED chips 120R to output first light (red light). The upper sides of the second LED chips 120G are covered with the second wavelength converting material 140b. The second wavelength converting material 140b converts light of a first wavelength (blue light) emitted from the second LED chips 120G to output second light (green light). The upper sides of the third LED chips 120B are covered with the translucent material 150 rather than a wavelength converting material. The third LED chips 120B outputs light of a first wavelength (blue light) without wavelength conversion.

When the first wavelength converting material 140a is applied to the upper sides of the first LED chips 120R, the second wavelength converting material 140b is applied to the upper sides of the second LED chips 120G, and the translucent material 150 is applied to the upper sides of the third LED chips 120B, the mesh 130 serves as a frame that limits the first wavelength converting material 140a to the upper sides and lateral sides of the first LED chips 120R, the second wavelength converting material 140b to the upper sides and lateral sides of the second LED chips 120G, and the translucent material 150 to the upper sides and lateral sides of the third LED chips 120B. That is, the chip spacing portions 132 of the mesh 130 are located between the LED chips and the pixel spacing portions 134 of the mesh 130 are located between the neighboring pixels. With these arrangements, the mesh 130 limits the application of the first wavelength converting material to the upper sides and lateral sides of the first LED chips 120R, limits the application of the second wavelength converting material to the upper sides and lateral sides of the second LED chips 120G, and limits the application of the translucent material 150 to the upper sides and lateral sides of the third LED chips 120B. As a result of these limitations, the application areas of the wavelength converting materials or the translucent material are clearly distinguished, achieving high precision of dotting, squeezing or bonding for applying the wavelength converting materials or the translucent material to the upper sides of the corresponding LED chips. As mentioned earlier, the mesh masks the exposed areas of the substrate between the LED chips to reduce the reflection of external light, resulting in an improvement in display image quality. Here, the exposed areas of the substrate indicate surface areas of the substrate that are not mounted with the LED chips and are exposed when viewed from the top.

The module spacing portions 136 of the mesh 130 are located on the seam S2 between the neighboring unit substrates 110b and 110c so that the seam S2 can be effectively covered.

When comparing the widths of the chip spacing portions 132, the pixel spacing portions 134, and the module spacing portions 136 of the mesh 130, the widths of the chip spacing portions 132 are designed to be smaller than those of the pixel spacing portions 134 because the distances between the LED chips are substantially smaller than those between the pixels. When the micro-LED display panel consists of an array of the plurality of unit substrates 110b and 110c, the distances between the pixels adjacent to the seam S2 should be substantially the same as those between the pixels in the unit substrates (e.g., 110b). Thus, the widths of the pixel spacing portions 134 of the mesh 130 are designed to be substantially the same as those of the module spacing portions 136.

The mesh 130 has a black color that can minimize the reflection of light. The mesh 130 may be made of a resin or metal material. A black colored plastic material or a black material may be used for the mesh 130.

The first wavelength converting material 140a and the second wavelength converting material 140b may be selected from quantum dot resin materials, phosphors-in-glass (PIGs), phosphors-in-silicon (PISs), and phosphor ceramics (PCs). Quantum dot resin materials as the first wavelength converting material 140a and the second wavelength converting material 140b may be vertically applied to cover the upper sides of the first LED chips 120R and the second LED chips 120G, respectively, by dotting or squeezing. Alternatively, quantum dot resin materials in the form of films may be attached to the upper sides of the first LED chips 120R and the second LED chips 120G. The translucent material may be applied to cover the upper sides of the third LED chips 120B by dotting or squeezing. Alternatively, the translucent material in the form of films may be vertically attached to the upper sides of the third LED chips 120B.

PIG is a material produced by mixing a glass powder with a phosphor powder and molding the mixture into a plate. PIS is a material produced by mixing a phosphor powder with a molding compound and forming the mixture into a film with a thickness of several micrometers. PC is a ceramic plate phosphor produced by powder sintering.

PIGs as the first wavelength converting material 140a and the second wavelength converting material 140b may be applied to cover the upper sides of the first LED chips 120R and the second LED chips 120G.

In FIG. 5, the first LED chips 120R and the third LED chips 120B are LED chips emitting light of a first wavelength (e.g., blue light), the second LED chips 120G are LED chips emitting light of a second wavelength (green light), the first wavelength converting material covers the upper sides of the first LED chips 120R and converts the wavelength of light from the first LED chips 120R to output first light (e.g., red light), and the translucent material covers the upper sides of the other LED chips 120G and 120B. Similarly to the description with reference to FIG. 4, when the first wavelength converting material 140a is applied to the upper sides of the first LED chips 120R and the translucent material 150 is applied to the upper sides of the second LED chips 120G and the third LED chips 120B, the mesh 130 serves as a frame that limits the first wavelength converting material 140a to the upper sides and lateral sides of the first LED chips 120R and the translucent material 150 to the upper sides and lateral sides of the second LED chips 120G and the third LED chips 120B. That is, the chip spacing portions 132 of the mesh 130 are located between the LED chips and the pixel spacing portions 134 of the mesh 130 are located between the neighboring pixels. With these arrangements, the mesh 130 limits the application of the first wavelength converting material to the upper sides of the first LED chips 120R and limits the application of the translucent material 150 to the upper sides and lateral sides of the second LED chips 120G and the third LED chips 120B. As a result of these limitations, the application areas of the wavelength converting material or the translucent material are clearly distinguished, achieving high precision of dotting, squeezing or bonding for applying the wavelength converting material or the translucent material to the upper sides of the corresponding LED chips. As mentioned earlier, the mesh masks the exposed areas of the substrate between the LED chips and the exposed areas of the substrate between the neighboring pixels to reduce the reflection of external light, resulting in an improvement in display image quality.

The module spacing portions 136 of the mesh 130 are located on the seam S2 between the neighboring unit substrates 110b and 110c to prevent display image quality from deterioration resulting from the seam S2.

Like in the previous embodiment described with reference to FIG. 4, when comparing the widths of the chip spacing portions 132, the pixel spacing portions 134, and the module spacing portions 136 of the mesh 130, the widths of the chip spacing portions 132 are designed to be smaller than those of the pixel spacing portions 134 because the distances between the LED chips are substantially smaller than those between the pixels. When the micro-LED display panel consists of an array of the plurality of unit substrates 110b and 110c, the distances between the pixels adjacent to the seam S2 should be substantially the same as those between the pixels in the unit substrates (e.g., 110b). Thus, the widths of the pixel spacing portions 134 of the mesh 130 are designed to be substantially the same as those of the module spacing portions 136.

The mesh 130 is arranged on the substrate mounted with the LED chips, the LED chips are selectively covered with the wavelength converting material or the translucent material by a suitable technique such as dotting, squeezing or bonding or are attached with pieces of PIG, PIS or PC, and a protective film 160 is further bonded thereon to prevent light reflection or protect a final display. This embodiment is illustrated in FIG. 6.

FIG. 6 is a cross-sectional view illustrating a state in which the protective film 160 is further bonded to the micro-LED display panel 100. Particularly, the LED chips 120R, 120G, and 120B are LED chips emitting light of a first wavelength (blue light), the first wavelength converting material is applied to cover the upper sides of the first LED chips 120R, the second wavelength converting material is applied to cover the upper sides of the second LED chips 120G, the translucent material is applied to cover the third LED chips 120B, and the protective film 160 is further bonded thereon, as in FIG. 4. In this case, the first wavelength converting material 140a is located between the protective film 160 and the first LED chips 120R, the second wavelength converting material 140b is located between the protective film 160 and the second LED chips 120G, and the translucent material 150 is located between the protective film 160 and the third LED chips 120B.

Although not illustrated, the first LED chips 120R and the third LED chips 120B are LED chips emitting light of a first wavelength (e.g., blue light), the second LED chips 120G are LED chips emitting light of a second wavelength (green light), the first wavelength converting material covers the upper sides of the first LED chips 120R and converts the wavelength of light from the first LED chips 120R to output first light (e.g., red light), and the translucent material covers the upper sides of the other LED chips 120G and 120B, as in FIG. 5. The protective film 160 is then bonded thereon.

A polarization film (not illustrated) may be further bonded to the upper surface of the protective film 160 to achieve 3D display. The polarization film may be used instead of the protective film 160.

This construction can reduce the reflection of external light by the exposed areas of the substrate between the LED chips of the pixels and the exposed areas of the substrate between the pixels to improve contrast characteristics or achieve a seamless display, leading to high display image quality.

Next, a micro-LED display panel according to another embodiment of the present invention will be described with reference to FIGS. 7 to 15. Some of the reference numerals in FIGS. 1 to 6 are found in FIGS. 7 to 15 but it should be noted that a description of the micro-LED display panel according to another embodiment of the present invention is given with reference to FIGS. 7 to 15.

Figure 7:
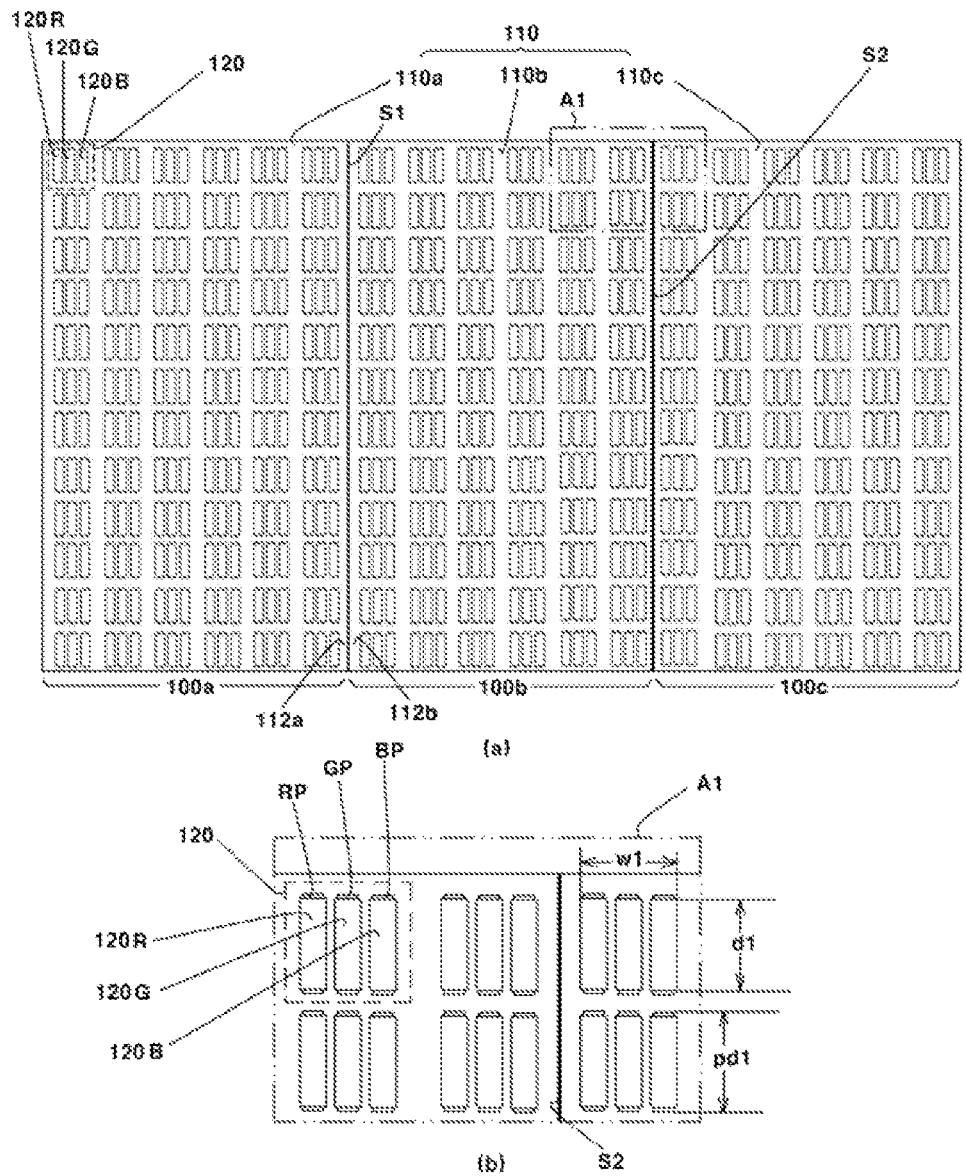
FIG. 7 is a plan view illustrating a micro-LED display panel according to another embodiment of the present invention in which pixels consisting of groups of LED chips are mounted on a substrate (top) and an enlarged view of area A1 (bottom)
Figure 8:
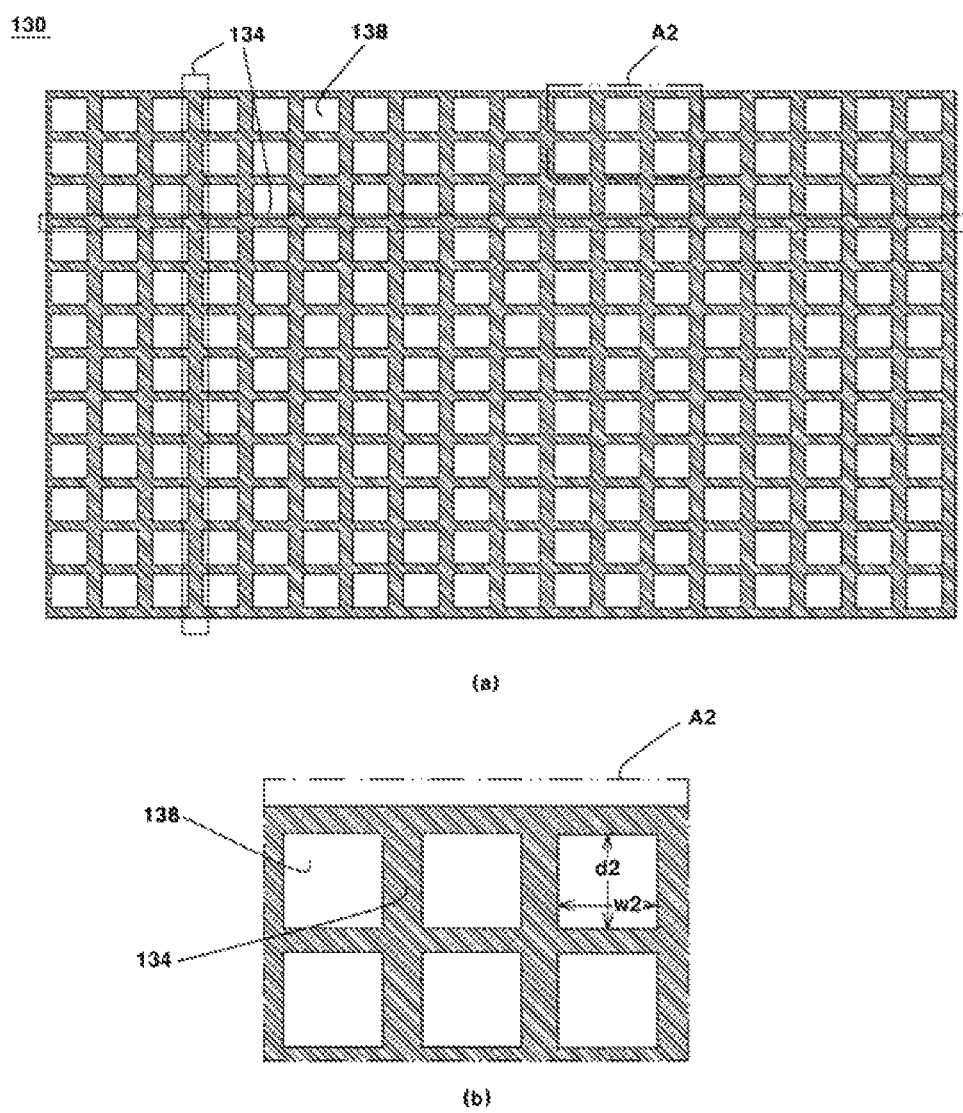
FIG. 8 is a plan view of a mesh arranged on the upper surface of the substrate of FIG. 7.
Figure 9:
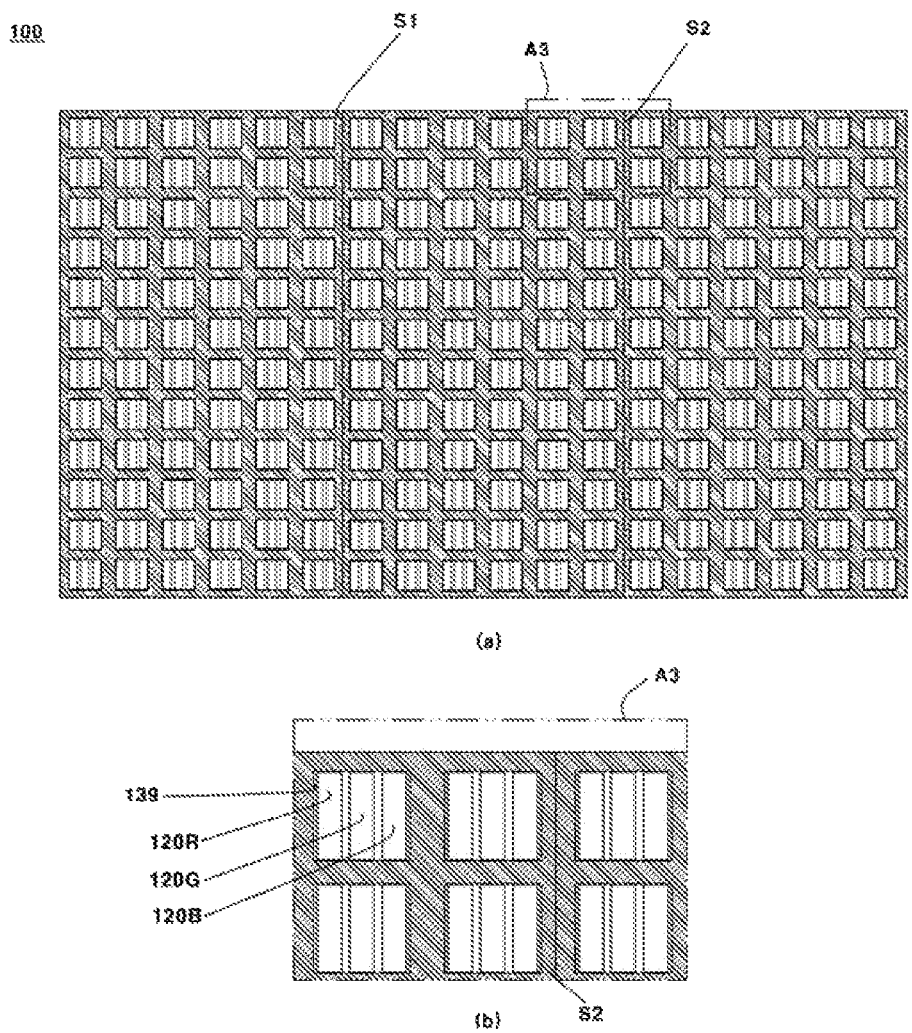
FIG. 9 is a plan view of a micro-LED display panel according to another embodiment of the present invention in which the mesh of FIG. 8 is arranged on the substrate of FIG. 7, specifically the pixels are accommodated in corresponding openings of the mesh and pixel spacing portions are arranged between the pixels.
Figure 10:
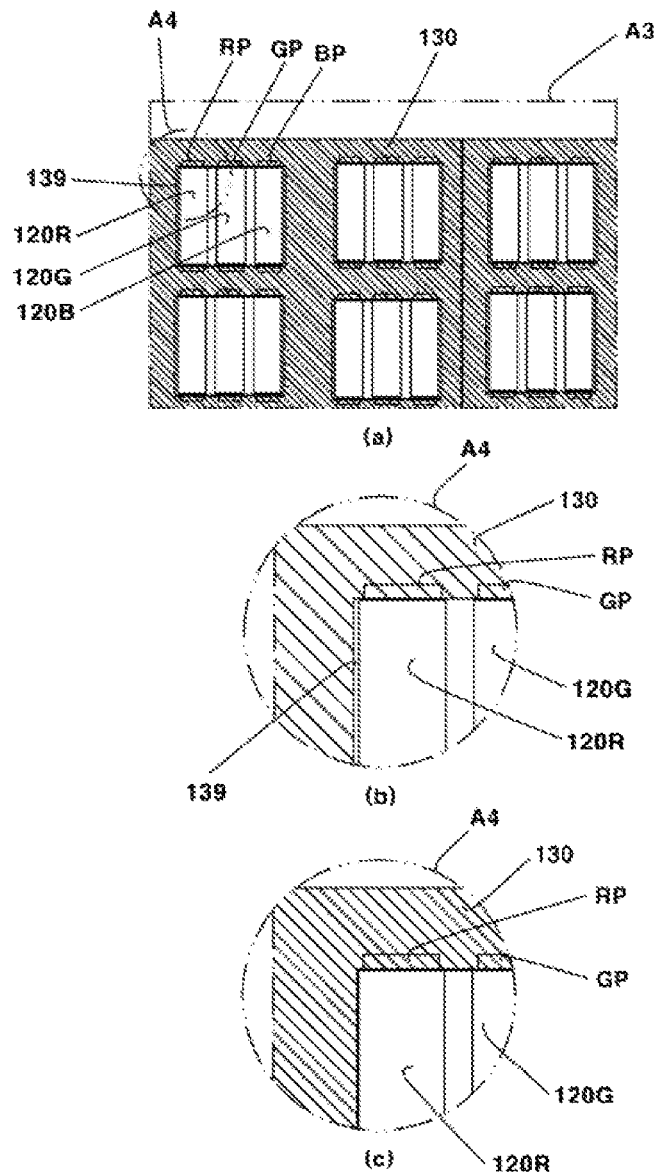
FIG. 10 illustrates an enlarged view of area A3 of FIG. 9 and examples of the enlarged view.
Figure 11:
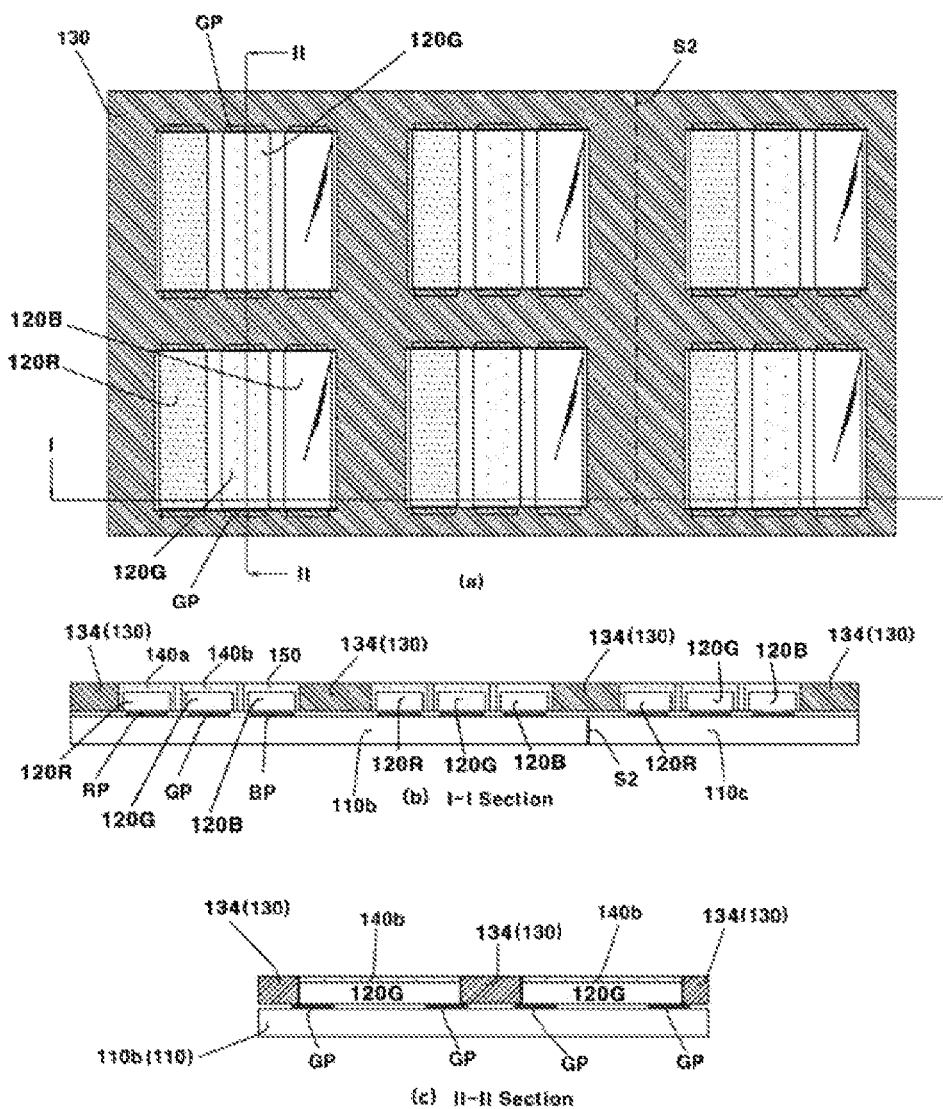
FIGS. 11 and 12 are enlarged views of area A3 of FIG. 9 and their corresponding cross-sectional views.
Figure 12:
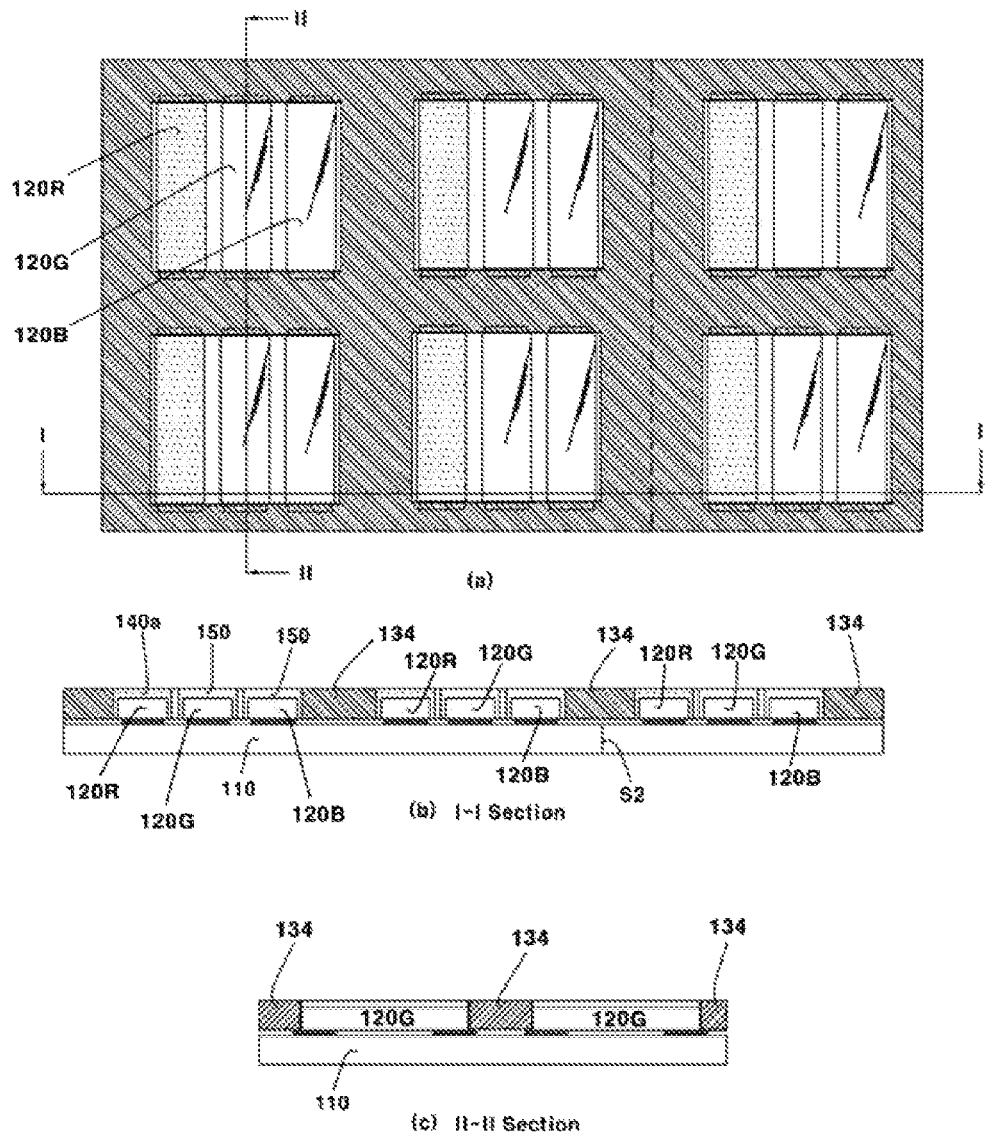
Figure 13:
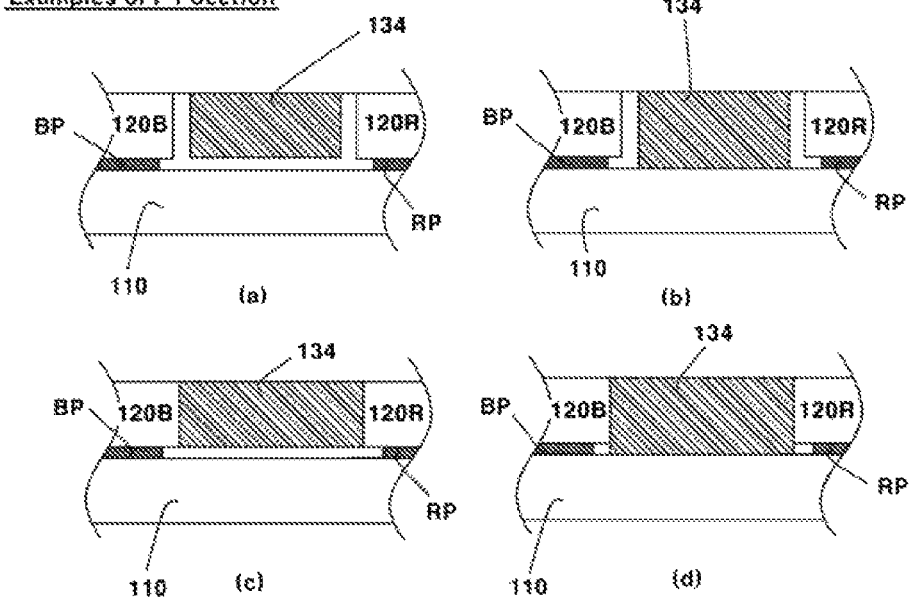
FIG. 13 illustrates examples of pixel spacing portions of a mesh arranged between two adjacent pixels in a cross-sectional view taken along line I-I of FIG. 11.
Figure 14:
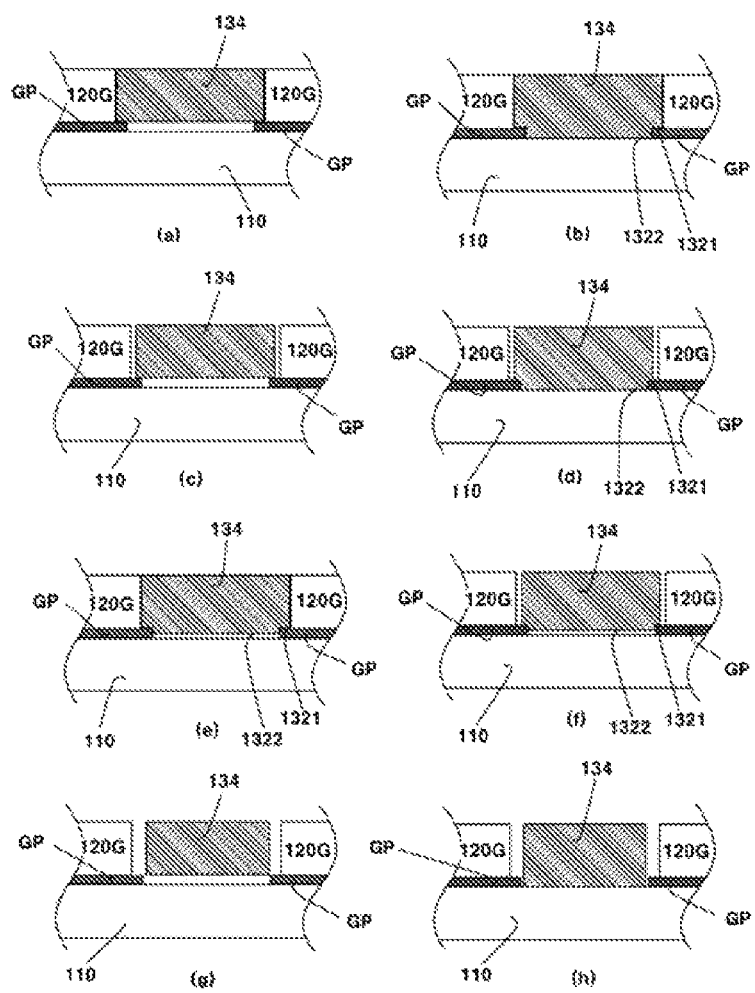
FIG. 14 illustrates examples of pixel spacing portions of a mesh arranged between two adjacent pixels in a cross-sectional view taken along line II-II of FIG. 11.

(a) of FIG. 7 is a plan view illustrating the micro-LED display panel in which pixels 120 consisting of groups of LED chips are mounted on a substrate 110. (b) of FIG. 7 is an enlarged view of area A1 of (a). (a) of FIG. 8 is a plan view of a mesh 130 arranged on the upper surface of the substrate 110 of FIG. 7. (b) of FIG. 8 is an enlarged view of area A2 of (a). (a) of FIG. 9 is a plan view of the micro-LED display panel 100 in which the mesh 130 of FIG. 8 is arranged on the substrate 110 of FIG. 7. (b) of FIG. 9 is an enlarged view of area A3 of (a). FIG. 10 illustrates an enlarged view of area A3 of FIG. 9 and examples of the enlarged view. FIGS. 11 and 12 are enlarged views of area A3 of FIG. 9 and their corresponding cross-sectional views. FIG. 13 illustrates examples of pixel spacing portions 134 of a mesh 130 arranged between two adjacent pixels in a cross-sectional view taken along line I-I of FIG. 11. FIG. 14 illustrates examples of pixel spacing portions 134 of a mesh 130 arranged between two adjacent pixels in a cross-sectional view taken along line II-II of FIG. 11.

Referring to FIGS. 7 to 15, the micro-LED display panel (100 of FIG. 9) includes a plurality of micro-LED modules 100a, 100b, and 100c. As used herein, the term "one micro-LED module" refers to a structure in which a plurality of pixels are mounted on one unit substrate. Thus, the micro-LED modules 100a, 100b, and 100c include unit substrates 110a, 110b, and 110c, respectively. That is, the micro-LED module 100a includes the unit substrate 110a, the micro-LED module 100b includes the unit substrate 110b, and the micro-LED module 100c includes the unit substrate 110c. In the description of this embodiment with reference to FIGS. 7 to 15, the substrates 110a, 110b, and 110c are also collectively referred to as a substrate 110. The micro-LED display panel 100 includes a plurality of pixels 120 and a mesh (130 of FIG. 8). The mesh 130 is arranged over the unit substrates 110a, 110b, and 110c and has pixel spacing portions 134 covering at least some exposed areas of the substrate between the plurality of pixels 120 or at least some areas of electrode pads (RP, GP, and BP of FIG. 7) and a plurality of openings 138. The openings 138 are delimited by the pixel spacing portions 134. The pixels 120 are designed such that each pixel is accommodated in the corresponding opening 138. The presence of the plurality of openings 138 in the mesh 130 allows the micro-LED display panel to have improved contrast characteristics or black characteristics as well as wide side viewing angle. The mesh 130 further includes module spacing portions covering adjacent portions (112a and 112b of FIG. 7) between the adjacent unit substrates. The module spacing portions effectively cover seam between the micro-LED modules, achieving a seamless display. The module spacing portions are not distinguished from the pixel spacing portions 134 in the drawings but the pixel spacing portion 134 located between the pixels on the unit substrate 110a and the pixels on the adjacent unit substrate 110b adjacent to the unit substrate 110a functions as the module spacing portion.

The micro-LED display panel 100 includes a first wavelength converting material (140a of FIG. 11 or 12) and/or a second wavelength converting material (140b of FIG. 11) and a translucent material (150 of FIG. 11 or 12). The plurality of pixels 120 are mounted on each of the unit substrates 110a, 110b, and 110c. For convenience, only one of the pixels is denoted by reference numeral 120 in FIG. 7. Each of the pixels 120 includes a first micro-LED chip 120R, a second micro-LED chip 120G, and a third micro-LED chip 120B. Six pixels 120, each of which includes three micro-LED chips 120R, 120G, and 120B, are illustrated in the enlarged view of area A1 of FIG. 7. The structures of the pixels 120 including the micro-LED chips 120R, 120G, and 120B will be described in detail with reference to vertical cross-sectional views of FIGS. 11 and 12. In FIG. 7, reference numerals S1 and S2 indicate seams between the micro-LED modules 100a, 100b, and 100c.

The mesh 130 is arranged on the substrate 110 mounted with the plurality of pixels 120. The mesh 130 includes a plurality of openings 138 that are limited by the pixel spacing portions 134, as illustrated in FIG. 8. As illustrated in (b) of FIG. 8, the three micro-LED chips 120R, 120G, and 120B are accommodated in each opening 138. Since each pixel 120 should be accommodated in the corresponding opening 138, the size of each opening 138 is designed to be equal to or slightly larger than that of the corresponding pixel 120. That is, the width w2 of each opening 138 in FIG. 8 may be designed to be equal to or slightly larger than that w1 of the corresponding pixel in FIG. 7. The length d2 of each opening 138 in FIG. 8 may be designed to be equal to or slightly larger than that d1 of the corresponding pixel in FIG. 7. The width and length of each opening 138 may be substantially different by 20 micrometers, preferably 5 to 15 micrometers, from the corresponding pixel 120.

These dimensional relationships will be described with reference to FIGS. 13 and 14. In FIG. 7, reference numeral pd1 denotes the maximum distance of the electrode pad BP mounted with the corresponding micro-LED chip (e.g., 120B) in one pixel.

As illustrated in FIG. 7, the substrate 110 consists of the three unit substrates 110a, 110b, and 110c. In this case, the mesh 130 has dimensions corresponding to the unit substrates 110a, 110b, and 110c. With these dimensions, the mesh 130 serves to cover areas other than the areas of the substrate 110 where the pixels 120 are mounted. As exemplified in FIG. 7, the electrode pads RP, GP, and BP include pads connected with cathode terminals of the micro-LED chips 120R, 120G, and 120B and pads connected with anode terminals of the micro-LED chips 120R, 120G, and 120B, which are independently disposed. However, the electrode pads connected with the anode terminals may also be combined into one structure such that the anode terminals of the micro-LED chips in one pixel are connected in common.

In the mesh 130 illustrated in FIG. 8, the pixel spacing portions 134 can be divided into widthwise ones and lengthwise ones (not designated by separate reference numerals). The widths of the widthwise pixel spacing portions 134 and the lengthwise pixel spacing portions 134 may vary depending on the lengthwise distances and widthwise distances between the pixels 120.

As illustrated in (b) of FIG. 9, the exposed areas of the electrode pads (see RP, GP, and BP of FIG. 7) are completely covered with the mesh and the dimensions of the openings may be appropriately adjusted such that small margins 139 exist in the unexposed areas of the electrode pads RP, GP, and BP.

That is, as illustrated in the enlarged views (b) and (c) of FIG. 10, the openings 138 may be designed such that areas other than the pixels 120 ((c) of FIG. 10) are completely covered with the mesh or may be designed such that the exposed areas of the electrode pads are completely covered with the mesh and some of the unexposed areas of the electrode pads are not covered with the mesh. The dimensions of the openings 138 will be described with reference to FIGS. 13 and 14, together with the description of the pixel spacing portions 134.

For full-color display, each pixel 120 should emit red light, green light, and blue light and the pixels should be controlled independently. For example, the three micro-LED chips 120R, 120G, and 120B constituting each pixel 120 may be constructed to emit red light, green light, and blue light, respectively, as illustrated in FIG. 9. Exemplary embodiments of the pixels emitting red light, green light, and blue light for full-color display will be described with reference to FIGS. 11 and 12.

As exemplified in FIG. 11, the first micro-LED chips 120R, the second micro-LED chips 120G, and the third micro-LED chips 120B are LED chips emitting light of a first wavelength (hereinafter referred to as "blue LED chips"), the first wavelength converting material 140*a* covers the upper sides of the first micro-LED chips 120R and converts the wavelength of light from the first micro-LED chips to output red light, and the second wavelength converting material 140*b* converts the wavelength of light from the second micro-LED chips 120G to output green light.

(a) of FIG. 11 is an enlarged view of area "A3" of FIG. 9. Left four pixels with respect to the seam S2 are mounted on the unit substrate 110*b* and right two pixels with respect to the seam S2 are mounted on the unit substrate 110*c*. Each of the pixels includes the three micro-LED chips 120R, 120G, and 120B emitting red light, green light, and blue light, respectively. The micro-LED chips 120R, 120G, and 120B are constructed such that light of the same wavelength region (blue light) is emitted. It should be understood that the three micro-LED chips of each pixel emit red light, green light, and blue light for full-color display. However, in this embodiment, three blue LED chips are used to constitute each pixel.

(b) of FIG. 11 is a cross-sectional view taken along line I-I of (a). For full-color display, the wavelength converting material 140*a* or 140*b* or the translucent material 150 is covered on the three micro-LED chips 120R, 120G, and 120B mounted on the substrate 110.

Specifically, the upper sides of the first micro-LED chips 120R are covered with the first wavelength converting material 140*a*. The first wavelength converting material 140*a* converts blue light emitted from the first micro-LED chips 120R to output red light. The upper sides of the second micro-LED chips 120G adjacent to the first micro-LED chips 120R are covered with the second wavelength converting material 140*b*. The second wavelength converting material 140*b* converts blue light emitted from the second micro-LED chips 120G to output green light. The upper sides of the third micro-LED chips 120B adjacent to the second micro-LED chips 120G are covered with the translucent material 150 rather than a wavelength converting material. The third micro-LED chips 120B outputs blue light without wavelength conversion.

The mesh 130 having the pixel spacing portions 134 and the openings 138 also serves as a frame that delimits the pixels 120. That is, the pixel spacing portions 138 of the mesh 130 are located between the neighboring pixels to distinguish the neighboring pixels from each other and allow the openings 138 to accommodate the corresponding pixels so that the tilting of the pixels can be substantially detected. Thus, the mesh essentially covers exposed areas of the substrate between the neighbor pixels and at least some exposed areas of the electrode pads so that the reflection of external light can be reduced, resulting in an improvement in display image quality. Here, the exposed areas of the substrate indicate surface areas of the substrate that are not mounted with the LED chips and are exposed when viewed from the top and the exposed areas of the electrode pads indicate areas of the electrode pads extending outward from the outer circumferences of the micro-LED chips in a state in which the micro-LED chips are mounted to constitute the pixels (see RP, GP, and BP of FIG. 7). The module spacing portions 136 of the mesh 130 cover the adjacent portions (112*a* and 112*b* of FIG. 7) between the unit substrates 110*a* and 110*b* so that the seam S2 can be effectively covered, achieving a seamless display.

The mesh 130 has a black color that can minimize the reflection of light. The mesh 130 may be made of a resin or metal material. A black colored plastic material or a black material may be used for the mesh 130.

The first wavelength converting material 140*a* and the second wavelength converting material 140*b* may be selected from quantum dot resin materials, phosphors-in-glass (PIGs), phosphors-in-silicon (PISs), and phosphor ceramics (PCs). Quantum dot resin materials as the first wavelength converting material 140*a* and the second wavelength converting material 140*b* may be vertically applied to cover the upper sides of the first micro-LED chips 120R, the second micro-LED chips 120G, and the third micro-LED chip 120B by dotting or squeezing. Alternatively, quantum dot resin materials in the form of films may be attached to the upper sides of the micro-LED chips 120R, 120G, and 120B. The translucent material may be applied to cover the upper sides of the third micro-LED chips 120B by dotting or squeezing. Alternatively, the translucent material in the form of films may be vertically attached to the upper sides of the third micro-LED chips 120B.

PIG is a material produced by mixing a glass powder with a phosphor powder and molding the mixture into a plate. PIS is a material produced by mixing a phosphor powder with a molding compound and forming the mixture into a film with a thickness of several micrometers. PC is a ceramic plate phosphor produced by powder sintering.

PIGs as the first wavelength converting material 140*a* and the second wavelength converting material 140*b* may be applied to cover the upper sides of the micro-LED chips 120R, 120G, and 120B.

Next, FIG. 12 illustrates that the first micro-LED chips 120R and the third micro-LED chips 120B are LED chips emitting blue light, the second micro-LED chips 120G are LED chips emitting green light, the first wavelength converting material covers the upper sides of the first micro-LED chips 120R and converts the wavelength of light from the first micro-LED chips 120R to produce red light, and the translucent material 150 covers the upper sides of the other micro-LED chips 120G and 120B. As in the description of FIG. 11, the mesh 130 having the pixel spacing portions 134 and the openings 138 covers the exposed areas of the substrate between the neighboring pixels and the exposed areas of the electrode pads between the pixels so that the reflection of external light can be reduced, resulting in an improvement in display image quality. The pixel spacing portions 134 of the mesh 130 cover the adjacent portions (112*a* and 112*b* of FIG. 7) between the unit substrates 110*a* and 110*b* so that the seam S2 can be effectively covered, achieving a seamless display.

When the micro-LED display panel consists of an array of the plurality of unit substrates, the distances between the pixels adjacent to the seam S2 should be substantially the same as those between the pixels in the unit substrates. Thus, the widths of the pixel spacing portions 134 of the mesh 130 are preferably designed to be substantially the same as those of the module spacing portions.

Next, specific examples of the pixel spacing portions 134 of the mesh 130 arranged between the adjacent pixels will be described with reference to FIGS. 13 and 14. FIG. 13 illustrates examples of portions of the cross-sectional view taken along line I-I of FIG. 11 and FIG. 14 illustrates examples of portions of the cross-sectional view taken along line II-II of FIG. 11. In the cross-sectional views of FIG. 13, the micro-LED chips adjacent in the widthwise direction are present in one pixel. In FIG. 14, the micro-LED chips adjacent in the lengthwise direction in the pixels are not present in one pixel.

In FIGS. 13 and 14, the micro-LED chips in the pixels 120 and the overlying wavelength converting material or translucent material are simply referred to as the micro-LED chips for convenience. Specifically, each of the cross-sectional views of FIG. 13 illustrates only the third micro-LED chip 120B in one pixel and the first micro-LED chip 120R in the neighboring pixel. Each of the cross-sectional views of FIG. 14 illustrates only the second micro-LED chip 120G in one pixel and the second micro-LED chip 120G in the neighboring pixel.

Referring to (a) of FIG. 13, the pixel spacing portion 134 of the mesh arranged between the neighboring pixels is not in contact with the micro-LED chips 120B and 120R and is not in contact with the upper surface of the substrate 110. Referring to (b) of FIG. 13, the pixel spacing portion 134 of the mesh arranged between the neighboring pixels is not in contact with the micro-LED chips 120B and 120R but is in contact with the upper surface of the substrate 110. Referring to (c) of FIG. 13, the pixel spacing portion 134 of the mesh arranged between the neighboring pixels is in contact with the micro-LED chips 120B and 120R but is not in contact with the upper surface of the substrate 110. Referring to (d) of FIG. 13, the pixel spacing portion 134 of the mesh arranged between the neighboring pixels is in contact with the micro-LED chips 120B and 120R and is in contact with the upper surface of the substrate 110.

Referring to each of (a) and (b) of FIG. 13, the pixel spacing portion 134 of the mesh 130 is formed such that the substrate is partially exposed between the pixels. Referring to each of (c) and (d) of FIG. 13, the pixel spacing portion 134 of the mesh 130 is formed such that the substrate is not exposed between the pixels.

As illustrated in each of (a) and (c) of FIG. 14, the mesh 130 may be supported by exposed areas of the electrode pads BP and RP. As illustrated in each of (b) and (d) of FIG. 14, the mesh 130 may be supported by the substrate 110 because the pixel spacing portion 134 is in contact with the upper surface of the substrate 110.

The sizes of the electrode pads BP and RP are determined taking into consideration the widths of the micro-LED chips and the distances between the micro-LED chips in each pixel. As illustrated in FIGS. 13 and 14, the sizes of the electrode pads BP and RP are determined corresponding to the distances between the adjacent micro-LED chips in each pixel or the micro-LED chips are mounted such that the upper surfaces of the electrode pads BP and RP are not exposed. For example, when the widths of the electrode pads are larger than those of the micro-LED chips or the upper surfaces of the electrode pads are exposed between the adjacent micro-LED chips by the tilting of the micro-LED chips during mounting, the pixel spacing portions 134 of the mesh 130 are located to cover some or all of the exposed areas of the electrode pads. Due to the reduced exposed areas of the electrode pads, the reflection of external light can be reduced.

Referring to (a) of FIG. 14, the pixel spacing portion 134 of the mesh is in contact with the micro-LED chips 120G to completely cover the exposed areas of the electrode pads GP but is spaced apart from the substrate 110. The mesh can be supported by the electrode pads GP.

Referring to (b) of FIG. 14, the pixel spacing portion 134 of the mesh is in contact with the micro-LED chips 120G to completely cover the exposed areas of the electrode pads GP and is in contact with the substrate 110. The mesh is supported by the substrate 110.

Referring to (c) of FIG. 14, the pixel spacing portion 134 of the mesh is not in contact with the micro-LED chips 120G such that the exposed areas of the electrode pads GP are partially covered and is spaced apart from the substrate 110. The mesh can be supported by the electrode pads GP.

Referring to (d) of FIG. 14, the pixel spacing portion 134 of the mesh is not in contact with the micro-LED chips 120G such that the exposed areas of the electrode pads GP are partially covered but is in contact with the substrate 110. The mesh is supported by the substrate.

Referring to (e) of FIG. 14, the pixel spacing portion 134 of the mesh is in contact with the micro-LED chips 120G to completely cover the exposed areas of the electrode pads GP but is spaced part from the substrate 110. The pixel spacing portion 134 is disposed at a slightly lower level than the upper surfaces of the electrode pads GP, unlike in (a). The mesh can be supported by the electrode pads GP.

Referring to (f) of FIG. 14, the pixel spacing portion 134 of the mesh is not in contact with the micro-LED chips 120G such that the exposed areas of the electrode pads GP are partially covered and is spaced apart from the substrate 110. The pixel spacing portion 134 is disposed at a slightly lower level than the upper surfaces of the electrode pads GP, unlike in (c). The mesh can be supported by the electrode pads GP.

Referring to (g) of FIG. 14, the pixel spacing portion 134 of the mesh is not in contact with the micro-LED chips 120G such that the exposed areas of the electrode pads GP are fully exposed and is spaced apart from the substrate 110. The mesh can be supported by structures (not illustrated) formed on the substrate 110.

Referring to (h) of FIG. 14, the pixel spacing portion 134 of the mesh is not in contact with the micro-LED chips 120G such that the exposed areas of the electrode pads GP are fully exposed but is in contact with the substrate 110. The mesh is supported by the substrate 100.

In each of (a), (c), (g) and (h) of FIG. 14, the lower surface of the pixel spacing portion 134 is planar. In contrast, in each of (b), (d), (e) and (f) of FIG. 14, the lower surface of the pixel spacing portion 134 is stepped. That is, the lower surface of the pixel spacing portion 134 has an upper end 1321 and a lower end 1322 divided by a step. In each of (b), (d), (e) and (f) of FIG. 14, the upper end 1322 is in contact with at least some exposed areas of the electrode pads GP between the pixels and the lower end 1322 is in contact with or spaced apart from the exposed upper surface of the substrate 110 between the pixels. In each of (b) and (d) of FIG. 14, the lower end 1322 is in contact with the exposed upper surface of the substrate 110 between the pixels. In each of (e) and (f) of FIG. 14, the lower end 1322 is spaced apart from the exposed upper surface of the substrate 110 between the pixels.

Figure 16:
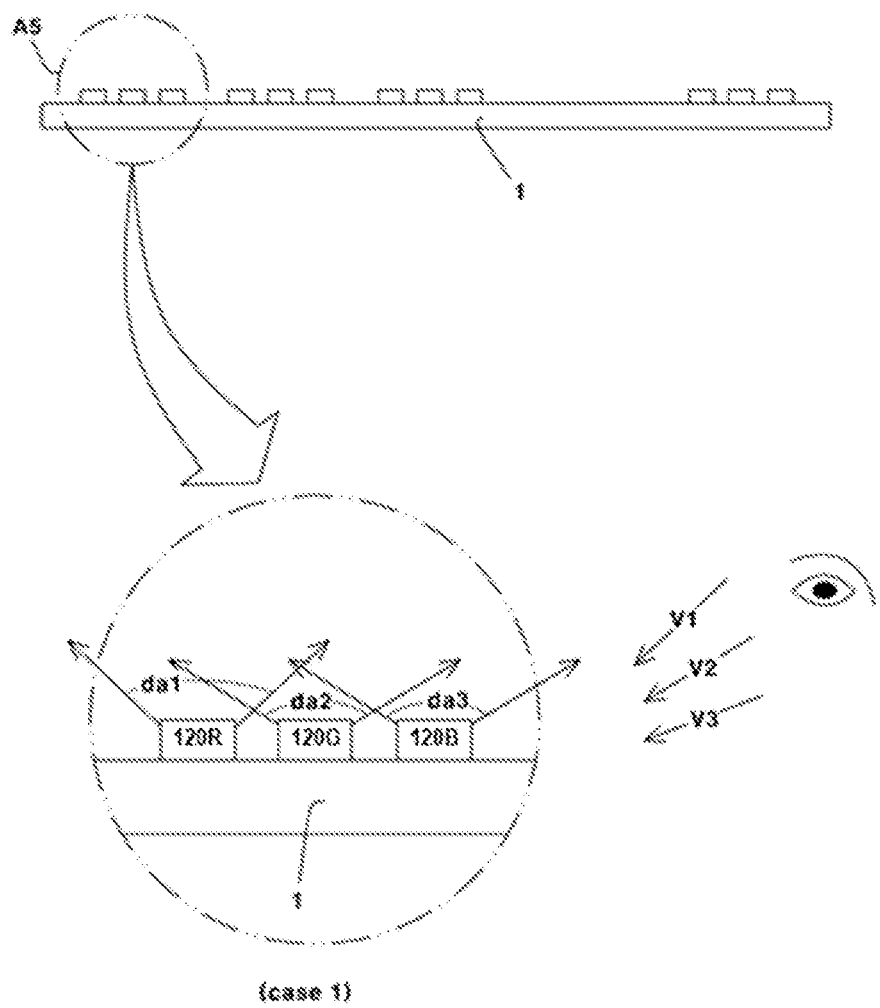

As described above, the pixel spacing portions 134 of the mesh 130 in the micro-LED display panel of the present invention may be embodied in various shapes such that at least some exposed areas of the substrate between the pixels and at least exposed areas of the electrode pads between the pixels are covered. Due to this construction, the reflection of external light is reduced, achieving wide side viewing angle, high display image quality, and reduced color mura. A description will be given concerning color mura with reference to FIGS. 16 and 17. FIG. 16 illustrates pixels mounted on a substrate 1. When LED chips are correctly mounted on pads (not illustrated) disposed on the substrate 1, as in an area A5 of FIG. 16, the distances between the LED chips are the same (case 1 of FIG. 16). The directivity angle da1 of the red LED chip 120R is typically 120°. The directivity angles da2 and da3 of the green LED chip 120G and the blue LED chip 120B are typically 140°. Since the directivity angles of the green LED chip and the blue LED chip are larger than that of the red LED chip, the red and blue colors are more visible than the red color when viewed from the side, causing color mura. In FIG. 16, the color mura increases in the order of v1, v2, and v3. As illustrated in FIG. 17, chips may be tilted during mounting (case 2) and the distances between chips may not be uniform (case 3). In both cases 2 and 3, color mura is observed when viewed from the front as well as the side. Such problems are solved by the use of the mesh structure proposed in the present invention.

The mesh 130 is arranged on the substrate mounted with the micro-LED chips, the micro-LED chips are selectively covered with the wavelength converting material or the translucent material by a suitable technique such as dotting, squeezing or bonding or are attached with pieces of PIG, PIS or PC, and a protective film 160 is further bonded thereon to prevent light reflection or protect a final display. This embodiment is illustrated in FIG. 15.

Figure 15:
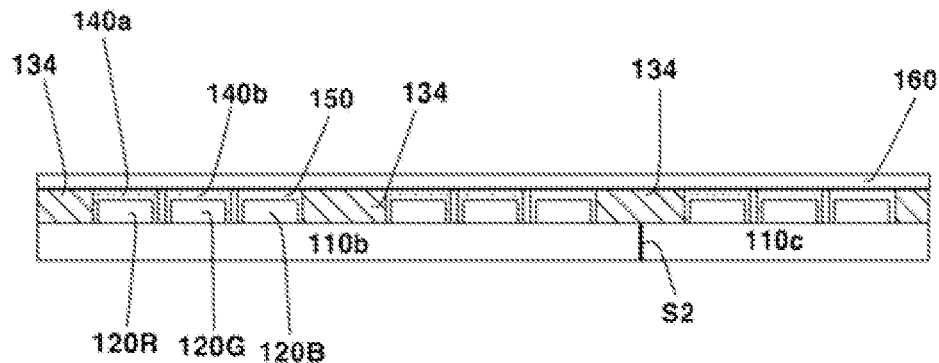
FIG. 15 is a cross-sectional view illustrating an exemplary embodiment of the present invention in which a protective film is further attached to the micro-LED display panel of FIG. 9.

FIG. 15 is a cross-sectional view illustrating a state in which the protective film 160 is further bonded to the micro-LED display panel 100 of FIG. 9. Particularly, the micro-LED chips 120R, 120G, and 120B are LED chips emitting blue light, the first wavelength converting material is applied to cover the upper sides of the first micro-LED chips 120R, the second wavelength converting material is applied to cover the upper sides of the second micro-LED chips 120G, the translucent material is applied to cover the third micro-LED chips 120B, and the protective film 160 is further bonded thereon, as in FIG. 11. In this case, the first wavelength converting material 140a is located between the protective film 160 and the first micro-LED chips 120R, the second wavelength converting material 140b is located between the protective film 160 and the second micro-LED chips 120G, and the translucent material 150 is located between the protective film 160 and the third micro-LED chips 120B.

Although not illustrated, the first micro-LED chips 120R and the third micro-LED chips 120B are LED chips emitting blue light, the second micro-LED chips 120G are LED chips emitting green light, the first wavelength converting material 140a covers the upper sides of the first micro-LED chips 120R and converts the wavelength of light from the first micro-LED chips 120R to produce red light, and the translucent material 150 covers the upper sides of the other micro-LED chips 120G and 120B, as in FIG. 12. The protective film 160 is then bonded thereon.

A polarization film (not illustrated) may be further bonded to the upper surface of the protective film 160 to achieve 3D display. The polarization film may be used instead of the protective film 160.

FIGS. 18 to 23 illustrate methods for fabricating micro-LED display panels according to exemplary embodiments of the present invention.

Referring first to FIG. 18, a substrate 210 formed with a plurality of electrode pads is prepared (a), micro-LED chips are mounted on the substrate 210 to form pixels 220 (b), and an underfill 235 is filled between the pixels 220 and between the micro-LED chips in the pixels (c). The upper surface of the underfill 235 is horizontal in FIG. 18 but the central portion of the upper surface of the underfill 235 may be concave (not illustrated).

After the underfill 235 is filled, the level of the underfill 235 should not be higher than the lowest one of the micro-LED chips. Then, a transparent film 260 attached with mesh pieces 230 (see (b) of FIG. 19) is attached to the upper surface of the underfill 235 (d). The resulting structure is illustrated in (e). The use of this structure ensures improved contrast characteristics, improved black characteristics, and wide side viewing angle. (a) of FIG. 19 is an enlarged view of area A6 of FIG. 18.

Referring next to FIG. 20, a substrate 310 formed with a plurality of electrode pads is prepared (a), micro-LED chips are mounted on the substrate 310 to form pixels 320 (b), and an underfill 335 is filled between the pixels 320 and between the micro-LED chips in the pixels (c). The upper surface of the underfill 335 is horizontal in FIG. 20 but the central portion of the upper surface of the underfill 335 may be concave (not illustrated).

After the underfill 335 is filled, the level of the underfill 335 should not be higher than the lowest one of the micro-LED chips. Then, a mesh 330 (see (b) of FIG. 21) is attached to the upper surface of the underfill 235 (d). The mesh 330 may have the same structure as the mesh 130 of FIG. 8. The resulting structure is illustrated in (e). A protective film may be further attached onto the structure. (a) of FIG. 21 is an enlarged view of area A7 of FIG. 20.

Referring finally to FIG. 22, a substrate 410 formed with a plurality of electrode pads is prepared (a), micro-LED chips are mounted on the substrate 410 to form pixels 420 (b), and a molding material 430 is filled between the pixels 420 (c). Then, an anti-glare film is attached onto the molded structure (d). Alternatively, an anti-glare material composed of nanoparticles may be coated on the molded structure (e). FIG. 23 is an enlarged view of area A8 of FIG. 22.

As is apparent from the above description, the improved micro-LED display panels of the present invention are constructed such that the reflection of external light by the exposed areas of the substrate between the pixels and the exposed areas of the electrode pads disposed on the unit substrates is reduced. Due to this construction, the micro-LED display panels can be used to manufacture displays with improved contrast characteristics and black characteristics as well as wide side viewing angle.

What is claimed is:

1. A micro-light emitting diode (LED) display panel comprising:
   a plurality of unit substrates, each unit substrate of the plurality of unit substrates being separated by a seam between two adjacent unit substrates and formed with a plurality of electrode pads;
   a plurality of pixels, each pixel of the plurality of pixels comprising a first micro-LED chip, a second micro-LED chip, and a third micro-LED chip mounted corresponding to respective electrode pads of the plurality of electrode pads; and
   a mesh arranged over the plurality of unit substrates, wherein the mesh comprises:
      pixel spacing portions covering at least some exposed areas of the plurality of unit substrates between respective pixels of the plurality of pixels and a plurality of openings accommodating corresponding pixels of the plurality of pixels, and
      module spacing portions covering respective upper surfaces of respective adjacent portions of respective adjacent unit substrates of the plurality of unit substrates.

2. The micro-LED display panel according to claim 1, wherein the pixel spacing portions cover at least some exposed areas of respective electrode pads of the plurality of electrodes between adjacent pixels of the plurality of pixels.

3. The micro-LED display panel according to claim 1, wherein respective pixel spacing portions are in contact with respective pixels of the plurality of pixels.

4. The micro-LED display panel according to claim 1, wherein a length of each respective opening of the plurality of openings is larger than a respective length of the corresponding pixels of the plurality of pixels by not more than 20 micrometers and a width of each respective opening of the plurality of openings is larger than a respective width of the corresponding pixels of the plurality of pixels by not more than 20 micrometers.

5. The micro-LED display panel according to claim 1, wherein respective pixel spacing portions are supported by respective electrode pads of the plurality of electrodes.

6. The micro-LED display panel according to claim 1, wherein a lower surface of respective pixel spacing portions has an upper end and a lower end divided by a step and the upper end of respective pixel spacing portions in contact with at least some exposed areas of respective electrode pads of the plurality of electrode pads between respective adjacent pixels of the plurality of pixels.

7. The micro-LED display panel according to claim 6, wherein the lower end of respective pixel spacing portions in contact with an exposed upper surface of respective unit substrates of the plurality of unit substrates between respective adjacent pixels of the plurality of pixels.

8. The micro-LED display panel according to claim 6, wherein the lower end of respective pixel spacing portions spaced apart from an exposed upper surface of respective unit substrates of the plurality of unit substrates between respective adjacent pixels of the plurality of pixels.

9. The micro-LED display panel according to claim 1, wherein the first micro-LED chip, the second micro-LED chip, and the third micro-LED chip emit blue light.

10. The micro-LED display panel according to claim 9, further comprising a first wavelength converting material covering an upper side of the first micro-LED chip and converting a wavelength of light from the first micro-LED chip to produce red light.

11. The micro-LED display panel according to claim 10, further comprising a second wavelength converting material covering an upper side of the second micro-LED chip and converting a wavelength of light from the second micro-LED chip to produce green light.

12. The micro-LED display panel according to claim 11, further comprising a translucent material covering an upper side of the third micro-LED chip.

13. The micro-LED display panel according to claim 12, further comprising a protective film.

14. The micro-LED display panel according to claim 13, wherein the first wavelength converting material is located between the protective film and the first micro-LED chip.

15. The micro-LED display panel according to claim 13, wherein the second wavelength converting material is located between the protective film and the second micro-LED chip.

16. The micro-LED display panel according to claim 13, wherein the translucent material is located between the protective film and the third micro-LED chip.

17. The micro-LED display panel according to claim 1, wherein the first micro-LED chip and the third micro-LED chip emit blue light and the second micro-LED chip emits green light.

18. The micro-LED display panel according to claim 17, further comprising a translucent material covering an upper side of the second micro-LED chip and an upper side of the third micro-LED chip.

19. The micro-LED display panel according to claim 1, wherein the mesh is black in color.

* * * * *